(12) United States Patent
Tsai et al.

(10) Patent No.: US 11,183,439 B2
(45) Date of Patent: Nov. 23, 2021

(54) PACKAGE STRUCTURE FOR POWER DEVICE

(71) Applicant: ACTRON TECHNOLOGY CORPORATION, Taoyuan (TW)

(72) Inventors: Hsin-Chang Tsai, Taoyuan (TW); Ching-Wen Liu, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 16/669,487

(22) Filed: Oct. 30, 2019

(65) Prior Publication Data

US 2021/0074604 A1 Mar. 11, 2021

(30) Foreign Application Priority Data

Sep. 5, 2019 (TW) .................................. 108132048

(51) Int. Cl.
*H01L 23/367* (2006.01)
*H01L 23/00* (2006.01)
(Continued)

(52) U.S. Cl.
CPC ........ *H01L 23/367* (2013.01); *H01L 23/3735* (2013.01); *H01L 23/433* (2013.01);
(Continued)

(58) Field of Classification Search
CPC ....... H01L 23/367–3677; H01L 23/433; H01L 25/04–0756; H01L 23/492–4928; H01L 2023/4037–4068
See application file for complete search history.

(56) References Cited

U.S. PATENT DOCUMENTS 6,262,489 B1 7/2001 Koors et al.
2005/0218505 A1 10/2005 Oman et al.
(Continued)

FOREIGN PATENT DOCUMENTS

CN 101218671 7/2008
DE 102012218304 9/2013
(Continued)

OTHER PUBLICATIONS

"Office Action of Taiwan Counterpart Application", dated Aug. 17, 2020, p. 1-p. 7.
(Continued)

*Primary Examiner* — Amar Movva
(74) *Attorney, Agent, or Firm* — JCIPRNET

(57) ABSTRACT

A package structure for power devices includes a heat dissipation insulating substrate, a plurality of power devices, a heat dissipation baseplate, and a thermal interface layer. The heat dissipation insulating substrate has a first surface and a second surface which are opposite to each other, and the power devices are coupled to the first surface of the heat dissipation insulating substrate. The heat dissipation baseplate is disposed at the second surface of the heat dissipation insulating substrate, wherein at least one of a surface of the heat dissipation baseplate and the second surface of the heat dissipation insulating substrate has at least one plateau, and the plateau is at least disposed within a projected area of the plurality of power devices. The thermal interface layer is disposed between the second surface of the heat dissipation insulating substrate and the surface of the heat dissipation baseplate.

11 Claims, 8 Drawing Sheets

(51) Int. Cl.
*H01L 23/498* (2006.01)
*H01L 23/373* (2006.01)
*H01L 25/04* (2014.01)
*H01L 23/433* (2006.01)

(52) U.S. Cl.
CPC ............ *H01L 23/498* (2013.01); *H01L 24/37* (2013.01); *H01L 24/40* (2013.01); *H01L 24/73* (2013.01); *H01L 25/04* (2013.01); *H01L 2224/37124* (2013.01); *H01L 2224/37147* (2013.01); *H01L 2224/37193* (2013.01); *H01L 2224/40137* (2013.01); *H01L 2224/40225* (2013.01); *H01L 2224/73255* (2013.01)

(56) References Cited

U.S. PATENT DOCUMENTS

| | | |
|---|---|---|
| 2006/0171118 A1 | 8/2006 | Pedoeem et al. |
| 2010/0288550 A1 | 11/2010 | Nagamatsu et al. |
| 2013/0003306 A1* | 1/2013 | Oota ................... H01L 23/4006 361/709 |
| 2017/0178928 A1 | 6/2017 | Williams et al. |

FOREIGN PATENT DOCUMENTS

| | | |
|---|---|---|
| DE | 112017005953 | 8/2019 |
| JP | 2005251997 | 9/2005 |
| JP | 2007019203 | 1/2007 |
| JP | 2011054732 | 3/2011 |
| JP | 2012064864 | 3/2012 |
| JP | 2013165122 | 8/2013 |
| JP | 2014179394 | 9/2014 |
| JP | 2015056608 | 3/2015 |
| TW | I593067 | 7/2017 |

OTHER PUBLICATIONS

"Office Action of Japan Counterpart Application", dated Mar. 24, 2021, p. 1-p. 4.

"Office Action of Germany Counterpart Application", dated May 4, 2021, p. 1-p. 15.

* cited by examiner

PACKAGE STRUCTURE FOR POWER DEVICE

CROSS-REFERENCE TO RELATED APPLICATION

This application claims the priority benefit of Taiwan application serial no. 108132048, filed on Sep. 5, 2019. The entirety of the above-mentioned patent application is hereby incorporated by reference herein and made a part of this specification.

BACKGROUND

Field of the Invention

The invention relates to a package structure and more particularly, to a package structure for power devices.

Description of Related Art

At present, a power module is a main core apparatus for electric energy conversion in various products, inside which power devices are packaged. When a heat dissipation substrate in the power module is connected with a chip circuit board, such as a direct bonded copper (DBC) ceramic substrate, the DBC substrate and the heat dissipation substrate, due to the thermal expansion coefficients mismatch, have different thermal deformations during a heating period, which results in a higher thermal stress at an edge of the DBC substrate.

In order to reduce the thermal stress with respect to the DBC substrate, a thermal interface layer with a greater thickness is currently used between the heat dissipation substrate and the DBC substrate for reducing the thermal stress. Nevertheless, along with the increase of the thickness of the thermal interface layer, a thermal resistance of the package structure is also increased.

SUMMARY

The invention provides a package structure for power devices that can solve the issue of the high thermal stress for the conventional power module and reduce the thermal resistance of the package structure.

The invention further provides another package structure for power devices that can reduce the thermal resistance of the power module without increasing the stress of a heat dissipation insulating substrate.

A package structure for power devices of the invention includes a heat dissipation insulating substrate, a plurality of power devices, a heat dissipation baseplate and a thermal interface layer. The heat dissipation insulating substrate has a first surface and a second surface which are opposite to each other, and the power devices are coupled to the first surface of the heat dissipation insulating substrate. The heat dissipation baseplate is disposed at the second surface of the heat dissipation insulating substrate. At least one of a surface of the heat dissipation baseplate and the second surface of the heat dissipation insulating substrate has at least one plateau, and the at least one plateau is at least disposed within a projected area of the plurality of power devices. The thermal interface layer is disposed between the second surface of the heat dissipation insulating substrate and the surface of the heat dissipation baseplate.

In an embodiment of the invention, an area ratio of the at least one plateau occupying the surface of the heat dissipation baseplate is between 10% and 35%.

In an embodiment of the invention, at least one of the plurality of power devices is coupled to the first surface in a flip-chip bonding manner.

In an embodiment of the invention, the package structure for power devices further includes a conductive clip disposed on a side opposite to a side on which the power devices are bonded to the heat dissipation insulating substrate and electrically connecting the power devices to the first surface of the heat dissipation insulating substrate.

In an embodiment of the invention, a material of the conductive clip includes, for example, aluminum, copper or a graphite.

In an embodiment of the invention, a sectional shape of each of the at least one plateau is a trapezoidal shape, a triangular shape, a circular shape or a rectangular shape.

In an embodiment of the invention, the heat dissipation insulating substrate includes a direct bonded copper (DBC) ceramic substrate, a direct plating copper (DPC) ceramic substrate, an insulated metal substrate (IMS) or a printed circuit board (PCB).

Another package structure for power devices of the invention includes a heat dissipation insulating substrate, a plurality of power devices, a heat dissipation baseplate and a thermal interface layer. The heat dissipation insulating substrate has a first surface and a second surface which are opposite to each other, and the power devices are coupled to the first surface of the heat dissipation insulating substrate. The heat dissipation baseplate is disposed at the second surface of the heat dissipation insulating substrate. The thermal interface layer respectively contacts with the second surface of the heat dissipation insulating substrate and the heat dissipation baseplate, and the thermal interface layer is located between the second surface and the heat dissipation baseplate. A minimum thickness of the thermal interface layer within a projected area of the power devices is less than a thickness thereof outside the projected area of the power devices.

In another embodiment of the invention, a surface of at least one of the heat dissipation baseplate and the heat dissipation insulating substrate contacting with the thermal interface layer has at least one plateau, and the at least one plateau is at least disposed within a projected area of the plurality of power devices.

In each of the embodiments of the invention, an area occupied by the at least one plateau is greater than or substantially equal to the projected area of the plurality of power devices.

In each of the embodiments of the invention, the at least one plateau is monolithically formed or thermally contact with the heat dissipation baseplate or the heat dissipation insulating substrate.

In each of the embodiments of the invention, the thermal interface layer includes a thermal grease, sintered silver (Ag) or a eutectic solder.

Based on the above, in the package structure for power devices of the invention, with the plateaus disposed between the heat dissipation insulating substrate and the heat dissipation plate, the thermal resistance of the overall package structure for power devices can be reduced without increasing the thermal stress of the heat dissipation insulating substrate.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
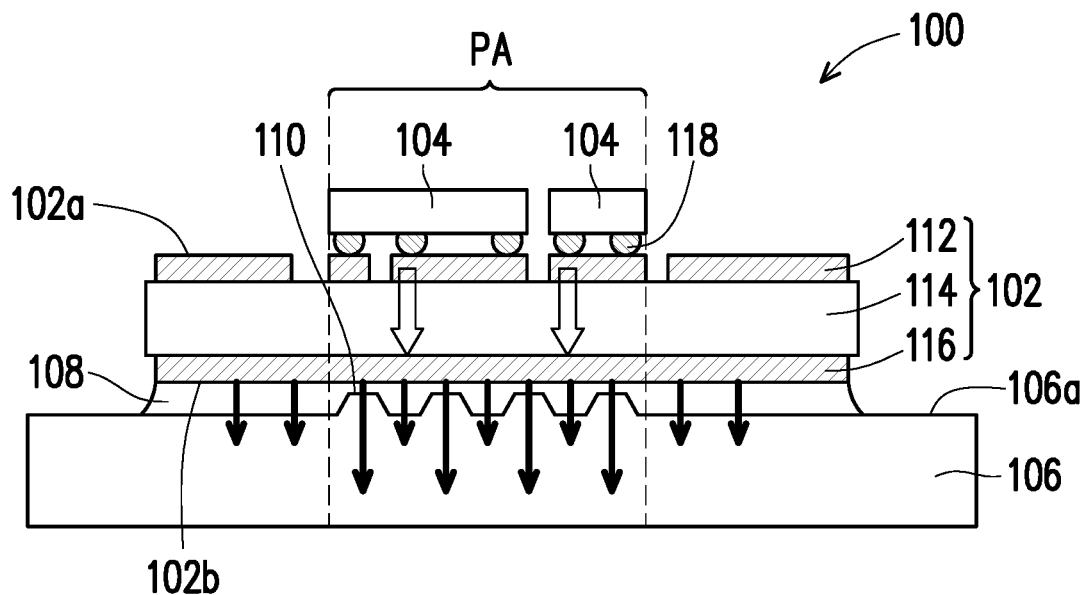
FIG. 1A is a schematic cross-sectional diagram illustrating a package structure for power devices according to a first embodiment of the invention.

Several different embodiments or examples are provided in the following disclosure for the implementation of different features of the invention. Certainly, these embodiments merely serves as examples, but are not construed limitations to the scope and applications of the invention. Furthermore, for clarity, the relative thickness and position of each component, layer or region may be reduced or enlarged. Moreover, similar or the same elements or features may be labeled by using similar or the same element symbols in each drawing, and if there is an element symbol in the drawing is the same as that in the previous drawing, the description related thereto is omitted.

FIG. 1A is a schematic cross-sectional diagram illustrating a package structure for power devices according to a first embodiment of the invention.

Referring to FIG. 1A, a package structure for power devices 100 of the present embodiment includes a heat dissipation insulating substrate 102, a plurality of power devices 104, a heat dissipation baseplate 106 and a thermal interface layer 108. The power devices 104 are coupled to a first surface 102a of the heat dissipation insulating substrate 102. In an embodiment, at least one of the power devices 104 is coupled to the first surface 102a in a flip-chip bonding manner. The heat dissipation insulating substrate 102 includes, for example, a direct bonded copper (DBC) ceramic substrate, a direct plating copper (DPC) ceramic substrate, an insulated metal substrate (IMS) or a printed circuit board (PCB). The heat dissipation baseplate 106 is disposed at a second surface 102b of the heat dissipation insulating substrate 102, a surface 106a of the heat dissipation baseplate 106 has a plurality of plateaus 110, and the plateaus 110 are at least disposed within a projected area PA of the power devices 104. In the present embodiment, the plateaus 110 are monolithically formed or thermally contact with the heat dissipation baseplate 106, and a sectional shape of each of the plateaus 110 is a trapezoidal shape. Nevertheless, the invention is not limited in this regard. The position, number, distribution range and cross-sectional shape of the above-mentioned plateaus 110 may be varied according to requirements. For example, the plateaus 110 may also be disposed at the second surface 102b, the number of the plateaus 110 may be 1, 2 or more, an area occupied by the plateaus 110 may be greater than or substantially equal to the projected area PA of the power devices 104, the plateaus 110 and the heat dissipation baseplate 106 may be separated from each other, and the sectional shape of each of the plateaus 110 may be a triangular shape, a circular shape, a rectangular shape, etc. Regarding the thermal interface layer 108, it is disposed between the second surface 102b of the heat dissipation insulating substrate 102 and the surface 106a of the heat dissipation baseplate 106, wherein the thermal interface layer 108 may include a solder, such as a thermal grease, a sintered silver (Ag) or a eutectic solder.

Continuously referring to FIG. 1A, the heat dissipation insulating substrate 102 has, for example, a patterned circuit 112, and the patterned circuit 112 is formed on an insulating material plate 114. The second surface 102b of the heat dissipation insulating substrate 102 may have an entire lower circuit layer 116. For example, by forming a solder joint 118 on a pad (not shown) of each power device 104 and bonding the solder joints 118 right to the patterned circuit 112 of the heat dissipation insulating substrate 102 by using a flip-chip technique, the power devices 104 are bonded to the heat dissipation insulating substrate 102.

Due to the presence of the plateaus 110, a path for transmitting the heat generated by the power devices 104 to the heat dissipation baseplate 106 may be reduced, in a way like a small heat resistor connected in a parallel with a large heat resistor, thereby reducing an overall structural thermal resistance. As illustrated by down arrows in FIG. 1A, a large part of the heat generated from the power devices 104 is transmitted from the plateaus 110 to the heat dissipation baseplate 106, thereby simultaneously reducing the structural thermal resistance. In the meantime, a thickness of the thermal interface layer 108 outside the projected area PA of the power devices 104 (close to an edge of the heat dissipation insulating substrate 102) is sufficient for reducing a thermal stress of the package structure for power devices 100 (i.e., the edge of the heat dissipation insulating substrate 102).

Figure 1B:
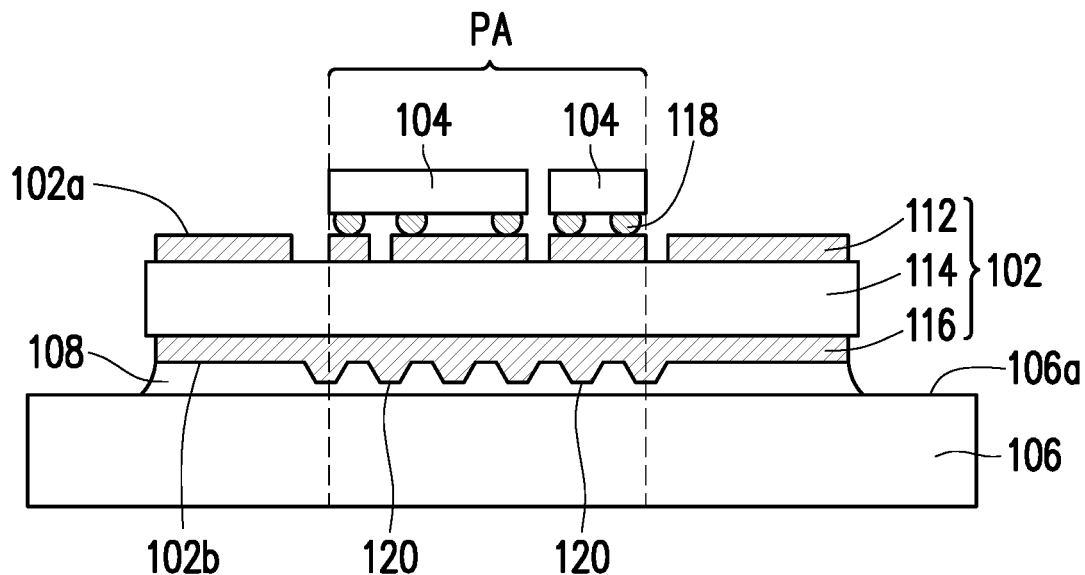
FIG. 1B is a schematic cross-sectional diagram illustrating another package structure for power devices according to the first embodiment.

FIG. 1B is a schematic cross-sectional diagram illustrating another package structure for power devices according to the first embodiment, wherein element symbols and part of the contents related to FIG. 1A are referenced herein, in which the same or similar elements are represented by similar or the same element symbols, and the description with respect to the same technical content is omitted. For a detailed description of the omitted parts, reference can be found in the above, and no repeated description is contained hereinafter.

In FIG. 1B, plateaus 120 are disposed at the second surface 102b and protrude toward the heat dissipation baseplate 106, and thus, a minimum thickness of the thermal interface layer 108 between the second surface 102b of the heat dissipation insulating substrate 102 and the surface 106a of the heat dissipation baseplate 106 within the projected area PA of the power devices 104 is less than the thickness of any region thereof outside the projected area PA. Additionally, the plateaus 120 are monolithically formed or thermally contact with the lower circuit layer 116 of the heat dissipation insulating substrate 102, and thus, the plateaus 120 and the heat dissipation insulating substrate 102 may be considered as a monolithically formed or thermally contact structure.

Figure 1C:
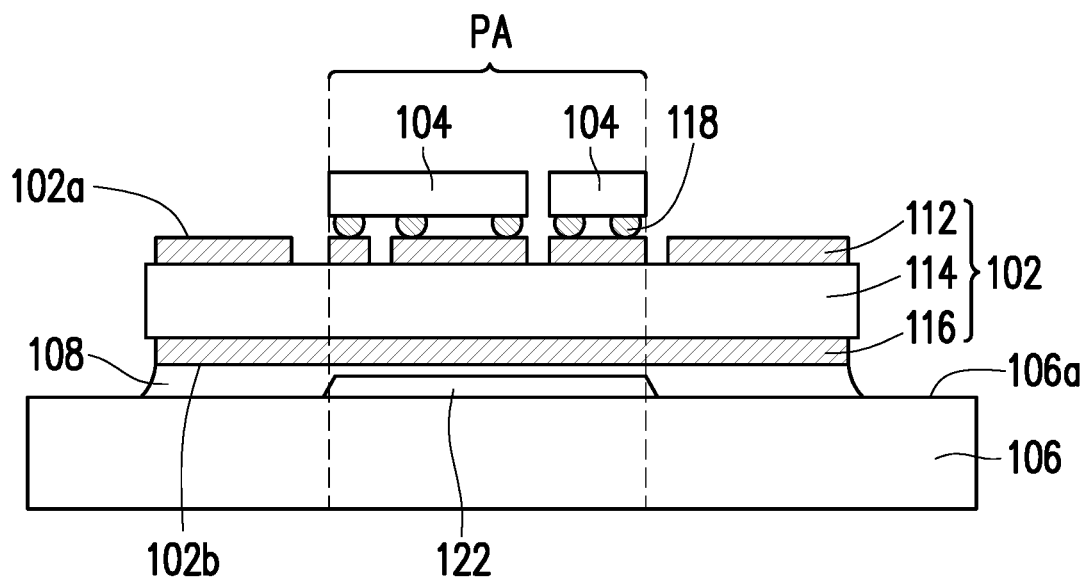
FIG. 1C is a schematic cross-sectional diagram illustrating yet another package structure for power devices according to the first embodiment.

FIG. 1C is a schematic cross-sectional diagram illustrating yet another package structure for power devices according to the first embodiment, wherein element symbols and part of the contents related to FIG. 1A are referenced herein, in which the same or similar elements are represented by similar or the same element symbols, and the description with respect to the same technical content is omitted. For a detailed description of the omitted parts, reference can be found in the above, and no repeated description is contained hereinafter.

In FIG. 1C, the number of the plateaus 122 is one, the area occupied by the plateau 122 is slightly greater than the projected area PA, and the plateau 122 and the heat dissipation baseplate 106 are separated from each other. Thus, the plateau 122 and the heat dissipation baseplate 106 may be made of different materials, but the invention is not limited thereto. The plateau 122 and the heat dissipation baseplate 106 may also be made of the same material.

Figure 1D:
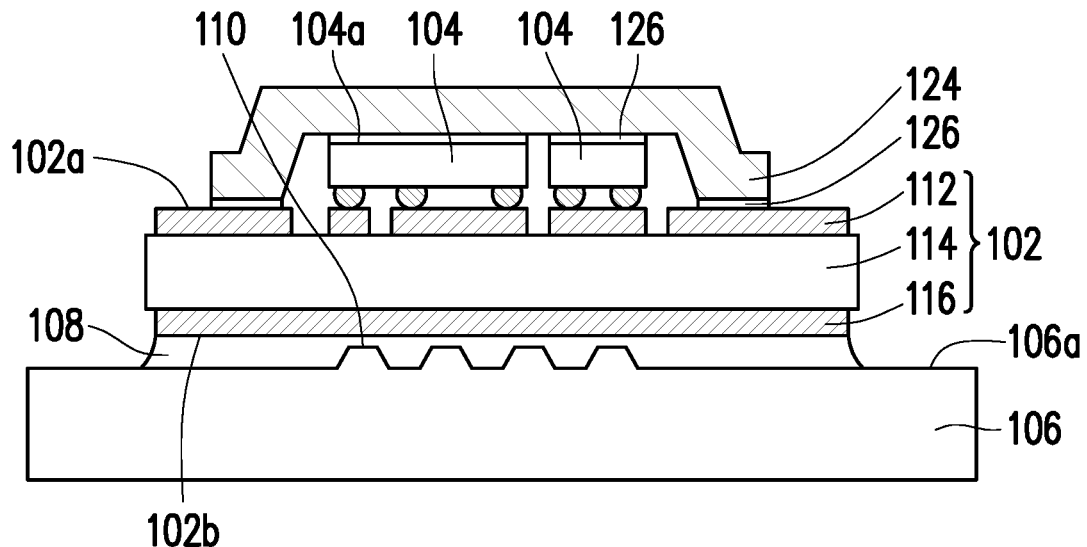
FIG. 1D is a schematic cross-sectional diagram illustrating still another package structure for power devices according to the first embodiment.

FIG. 1D is a schematic cross-sectional diagram illustrating still another package structure for power devices according to the first embodiment, wherein element symbols and part of the contents related to FIG. 1A are referenced herein, in which the same or similar elements are represented by similar or the same element symbols, and the description with respect to the same technical content is omitted. For a detailed description of the omitted parts, reference can be found in the above, and no repeated description is contained hereinafter.

In FIG. 1D, a conductive clip 124 is disposed on a side 104a opposite to a side on which the power devices 104 are bonded to the heat dissipation insulating substrate 102. The conductive clip 124 electrically connects the power devices 104 to the first surface 102a of the heat dissipation insulating substrate 102. In an embodiment, a material of the conductive clip 124 includes, for example, aluminum, copper or a graphite. In the meantime, one conductive clip 124 may electrically connect a plurality of power devices 104 to the heat dissipation insulating substrate 102. Nevertheless, the invention is not limited in this regard. One conductive clip 124 may also electrically connect only one power device 104 to the heat dissipation insulating substrate 102. In an embodiment, if the power devices 104 are vertical power devices, a part of the conductive clip 124 may be electrically connected to non-active regions of the vertical power devices, and another part of the conductive clip 124 may be electrically connected to the first surface 102a. Moreover, the first surface 102a and the conductive clip 124 may be electrically connected to each other via an additional solder layer 126, and the power devices 104 and the conductive clip 124 may also be electrically connected to each other via the additional solder layer 126, but the invention is not limited thereto. The solder layer 126 includes a solder, for example, sintered Ag or a eutectic solder.

Figure 2:
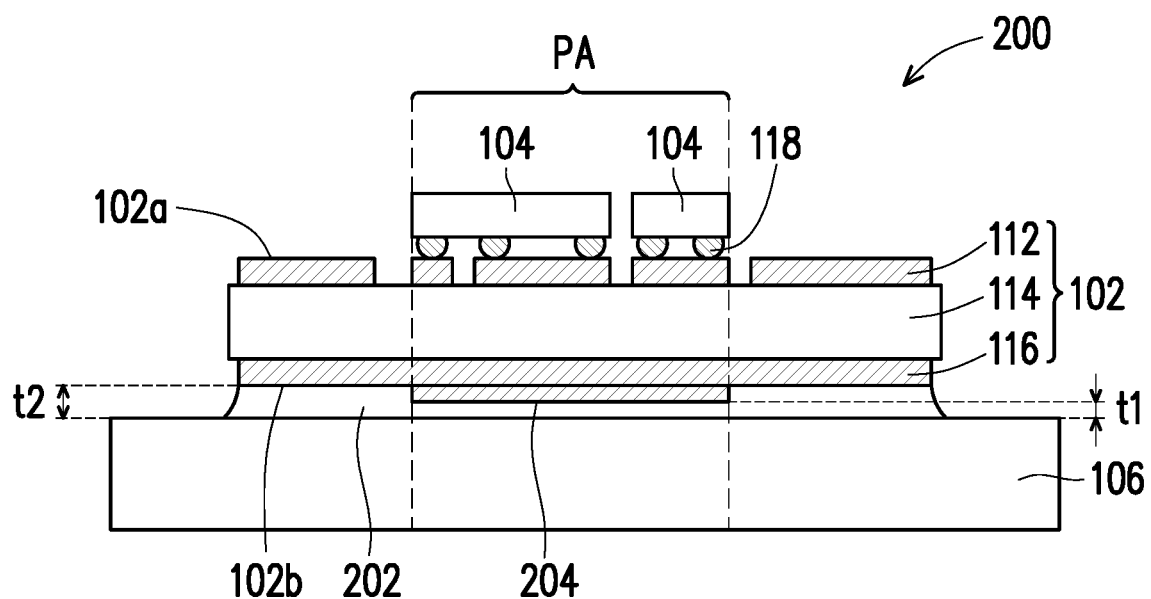
FIG. 2 is a schematic cross-sectional diagram illustrating a package structure for power devices according to a second embodiment of the invention.

FIG. 2 is a schematic cross-sectional diagram illustrating a package structure for power devices according to a second embodiment of the invention, wherein element symbols and part of the contents related to the first embodiment are referenced herein, in which the same or similar elements are represented by similar or the same element symbols, and the description with respect to the same technical content is omitted. For a detailed description of the omitted parts, reference can be found in the previous embodiment, and no repeated description is contained in the following embodiments.

Referring to FIG. 2, a package structure for power devices 200 of the present embodiment includes the heat dissipation insulating substrate 102, the plurality of power devices 104, the heat dissipation baseplate 106 and a thermal interface layer 202. The thermal interface layer 202 respectively contacts with the second surface 102b of the heat dissipation insulating substrate 102 and the heat dissipation baseplate 106, and a minimum thickness t1 of the thermal interface layer 202 within the projected area PA of the power devices 104 is less than a thickness t2 thereof outside the projected area PA of the power devices 104. Thus, a path (i.e., the minimum thickness t1) for transmitting the heat generated by the power devices 104 to the heat dissipation baseplate 106 may be reduced, thereby reducing the structural thermal resistance, and the thickness t2 of the thermal interface layer 202 outside the projected area PA (i.e., the edge of the heat dissipation insulating substrate 102) is sufficient for reducing the thermal stress of the package structure for power devices 200.

In FIG. 2, the surface of the heat dissipation insulating substrate 102 contacting with the thermal interface layer 202 further has a plateau 204, and the plateau 204 is disposed within the projected area PA of all the power devices 104. In the present embodiment, the plateau 204 is disposed under the lower circuit layer 116 of the heat dissipation insulating substrate 102, but the invention is not limited thereto. In another embodiment, the plateau 204 may be monolithically formed or thermally contact with the heat dissipation baseplate 106 or the heat dissipation insulating substrate 102. Moreover, the position, number, distribution range and cross-sectional shape of the above-mentioned plateau 204 may be varied according to requirements, which may be inferred with reference to the descriptions related to FIG. 1A, FIG. 1B, FIG. 1C and FIG. 1D and will not be repeated.

Experiments are numerated below for verifying the effects of the invention, but the scope of the invention is not limited to the experiment examples below.

Experiment Example 1

Figure 3A:
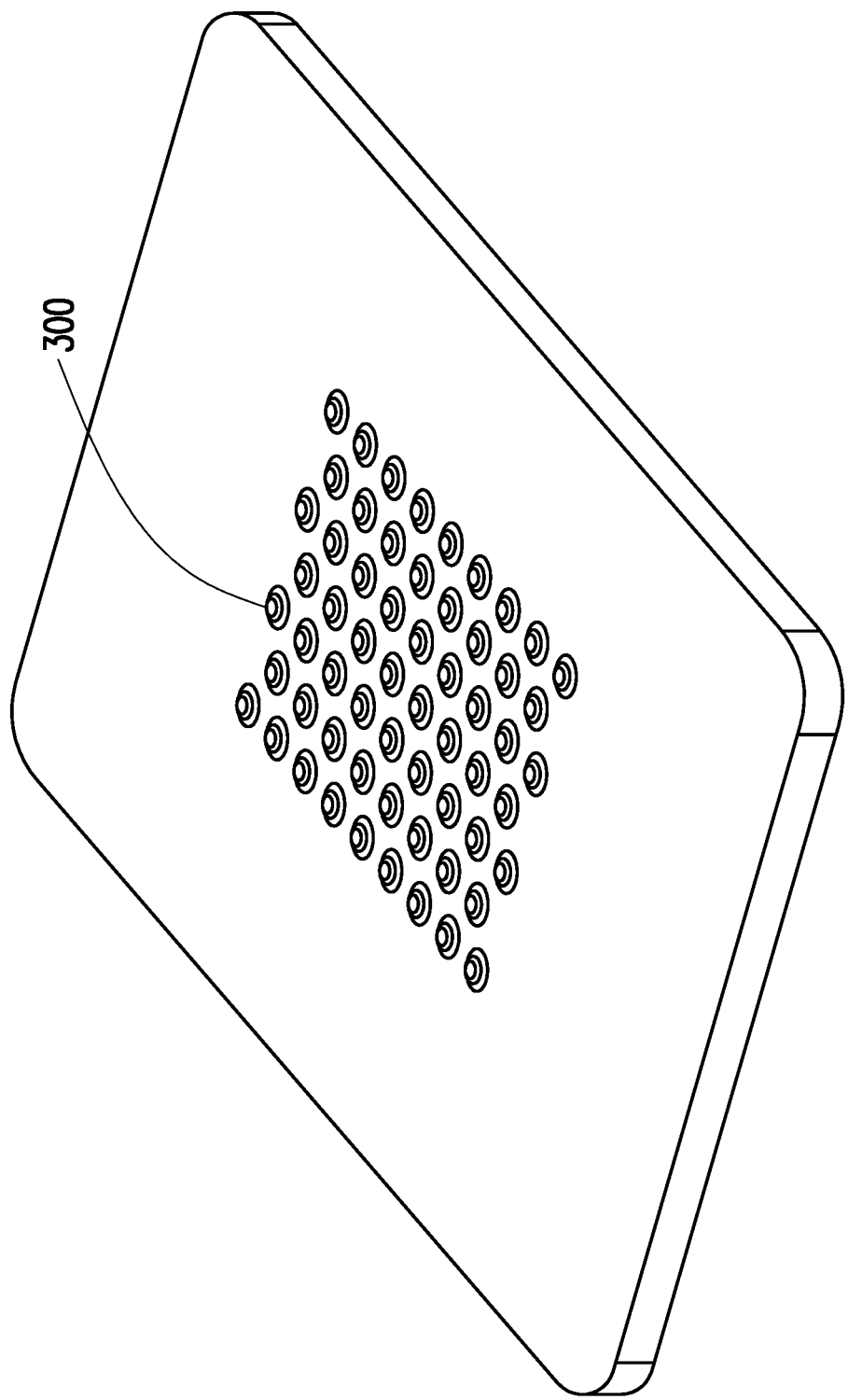
FIG. 3A is a schematic perspective diagram illustrating a heat dissipation baseplate of Experimental example 1.

A heat dissipation baseplate depicted in FIG. 3A was manufactured, wherein plateaus 300 were monolithically formed or thermally contact with the heat dissipation baseplate. Then, the heat dissipation baseplate depicted in FIG. 3A was used for assembly to form the package structure for power devices as illustrated in FIG. 1A.

Figure 4A:
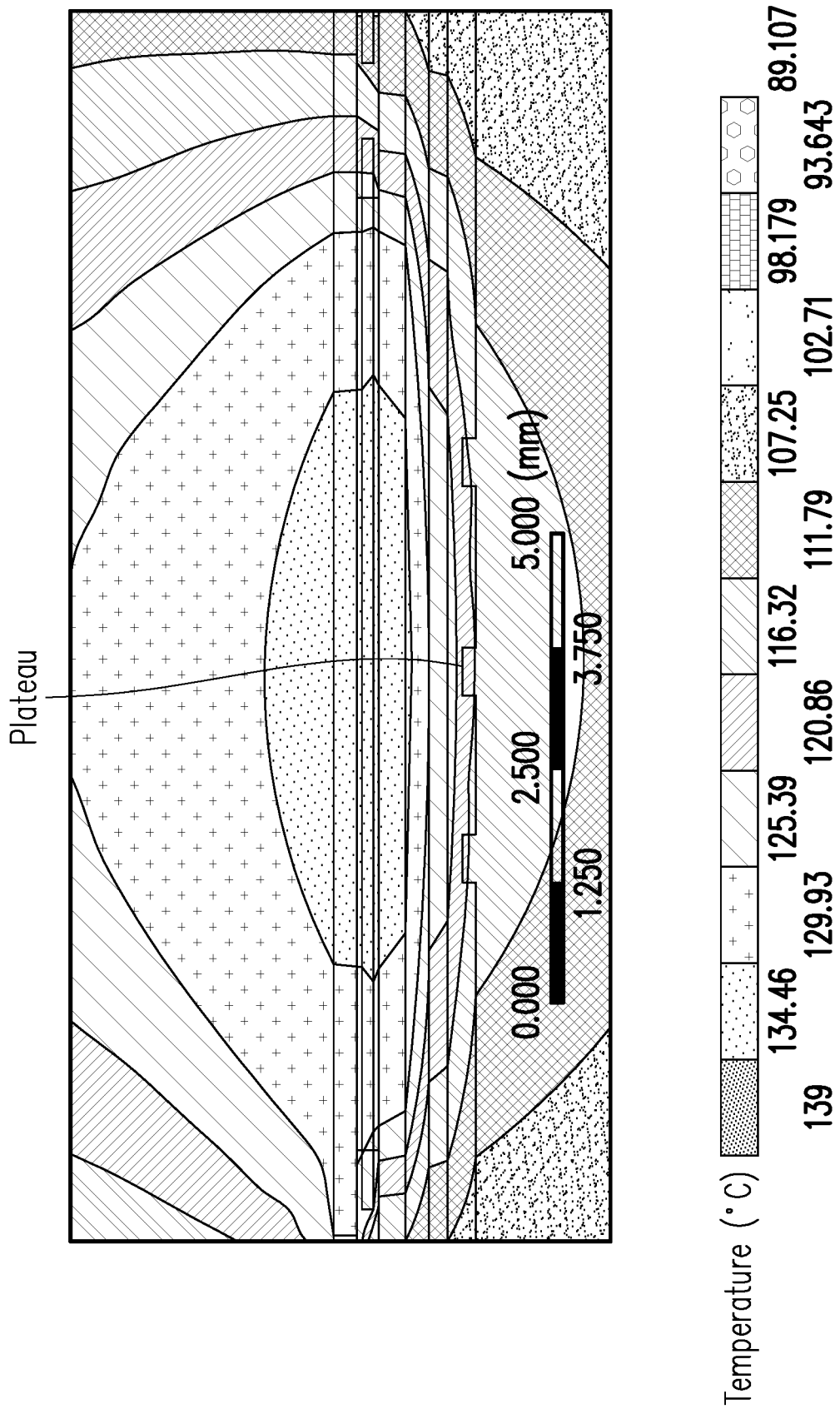
FIG. 4A is a schematic heat distribution diagram of a package structure for power devices of Experimental example 1.

A heat distribution of the overall package structure for power devices was measured in a condition that the power devices 104 generate the heat, thereby obtaining a heat distribution as illustrated in FIG. 4A.

Comparative Example

Figure 3B:
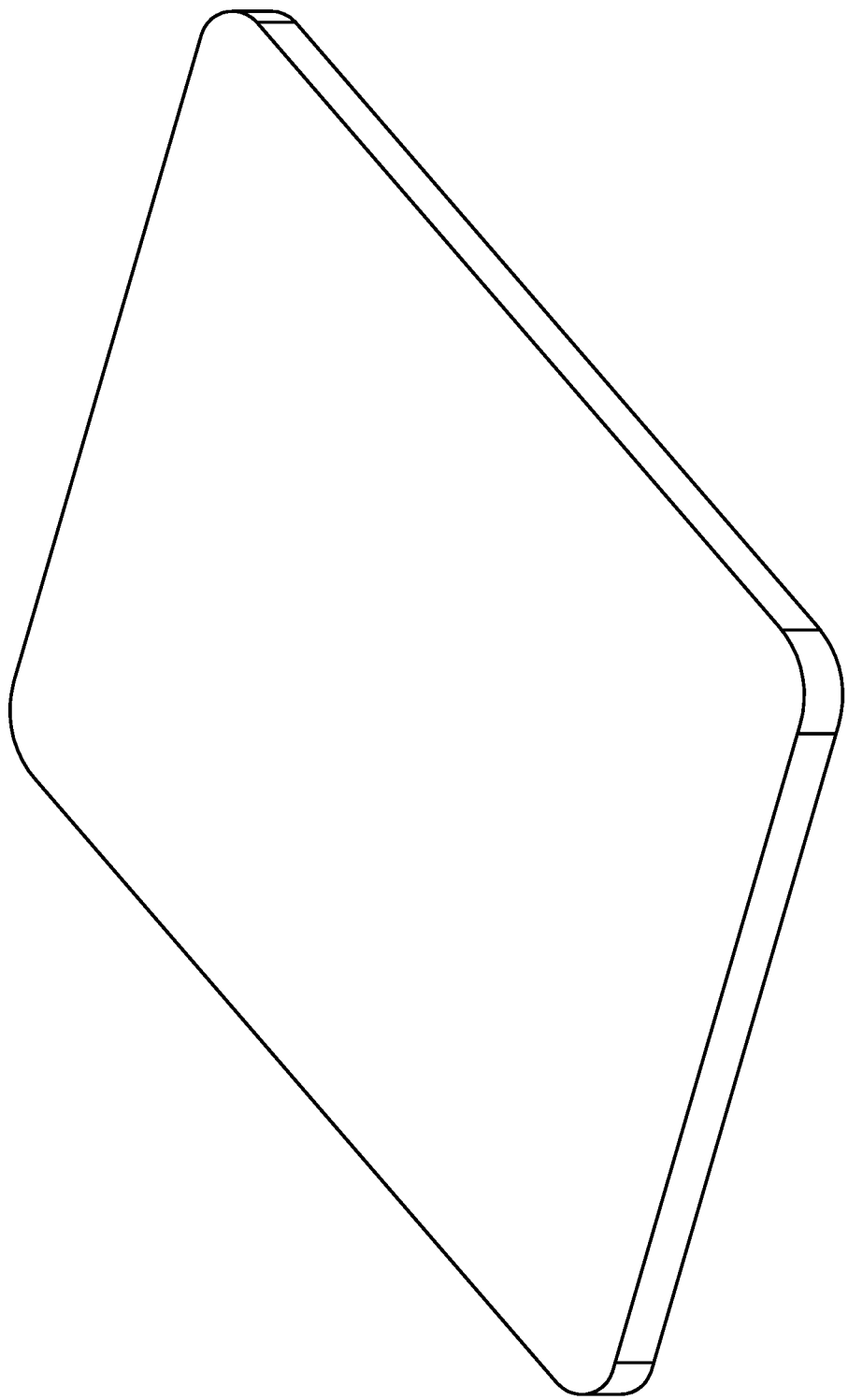
FIG. 3B is a schematic perspective diagram illustrating a heat dissipation baseplate of Comparative example.

A heat dissipation baseplate depicted in FIG. 3B was manufactured, and a surface thereof was a plane. Then, the heat dissipation baseplate depicted in FIG. 3B was used for assembly to form the package structure for power devices as illustrated in FIG. 1A, but with no plateaus.

Figure 4B:
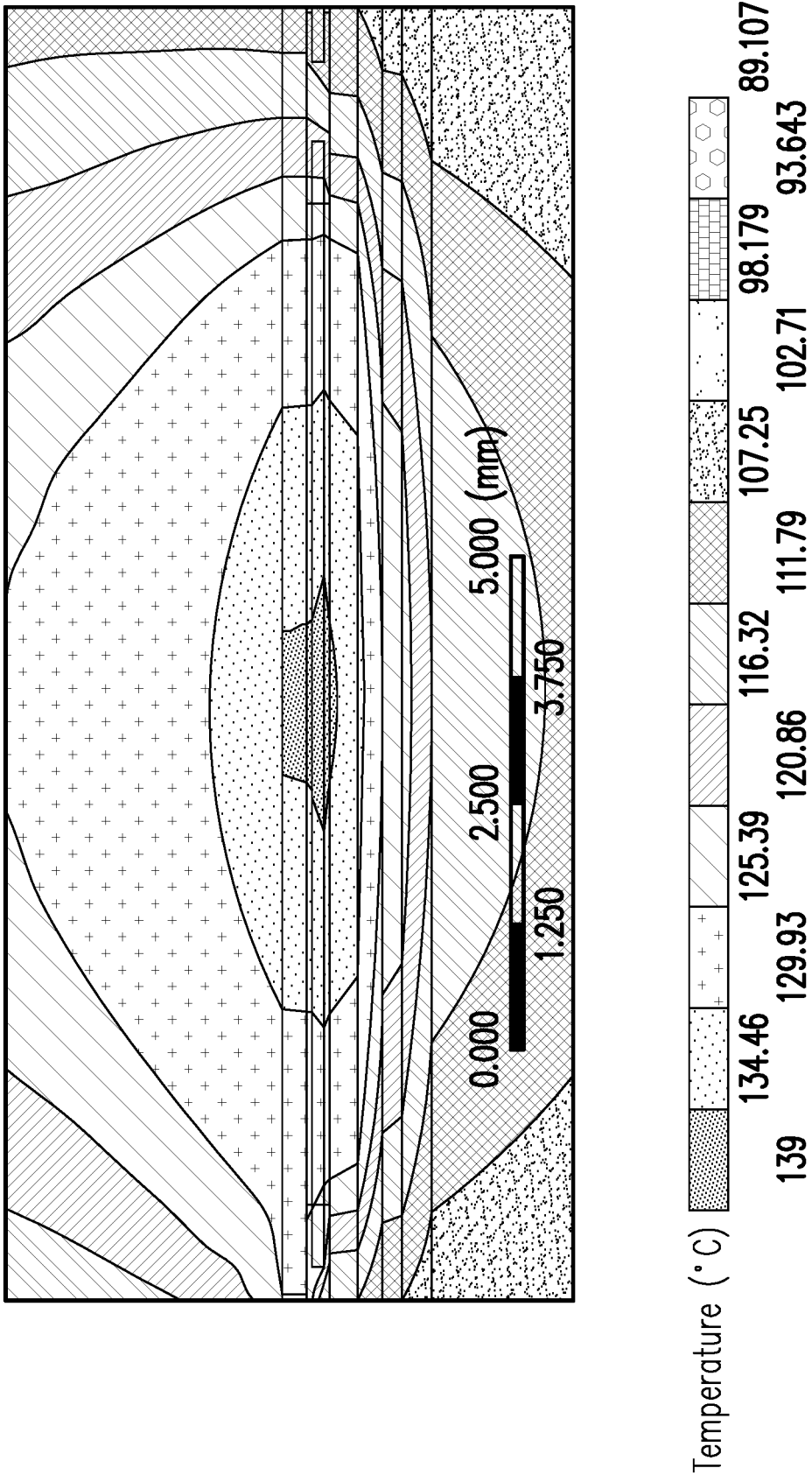
FIG. 4B is a schematic heat distribution diagram of a package structure for power devices of Comparative example.

A heat distribution of the overall package structure for power devices was measured in a condition that the power devices 104 generate the heat, thereby obtaining a heat distribution as illustrated in FIG. 4B.

It may be known according to FIG. 4A and FIG. 4B that the heat distribution of the package structure for power devices with the plateaus is more even than the heat distribution of the package structure for power devices with no plateaus and does not have any region with a temperature higher than 135° C. in the central part as that illustrated in FIG. 4B. Through analysis and comparison, Experimental example 1 has a thermal resistance of 0.137° C./W, while Comparative example has a thermal resistance of 0.141° C./W. Thus, the reduction of the thermal resistance may be 3%.

Moreover, for the package structures for power devices of Experimental example and Comparative example in the condition that the power devices generate the heat, a dice stress measurement was performed, and a result that Experimental example 1 has a stress of 128.4 MPa and Comparative example has a stress of 128.6 MPa was obtained. Thereby, it is evident that the disposition of the plateaus is capable of maintaining a lower thermal stress.

Experiment Example 2

Several heat dissipation baseplates like that illustrated in FIG. 3A were used for simulation, wherein an area ratio of the plateaus occupying a surface of the heat dissipation baseplates is between 0% and 40%, and the package structure for power devices as illustrated in FIG. 1A was assembled and formed, wherein the size of each component was set to be the same.

Figure 5:
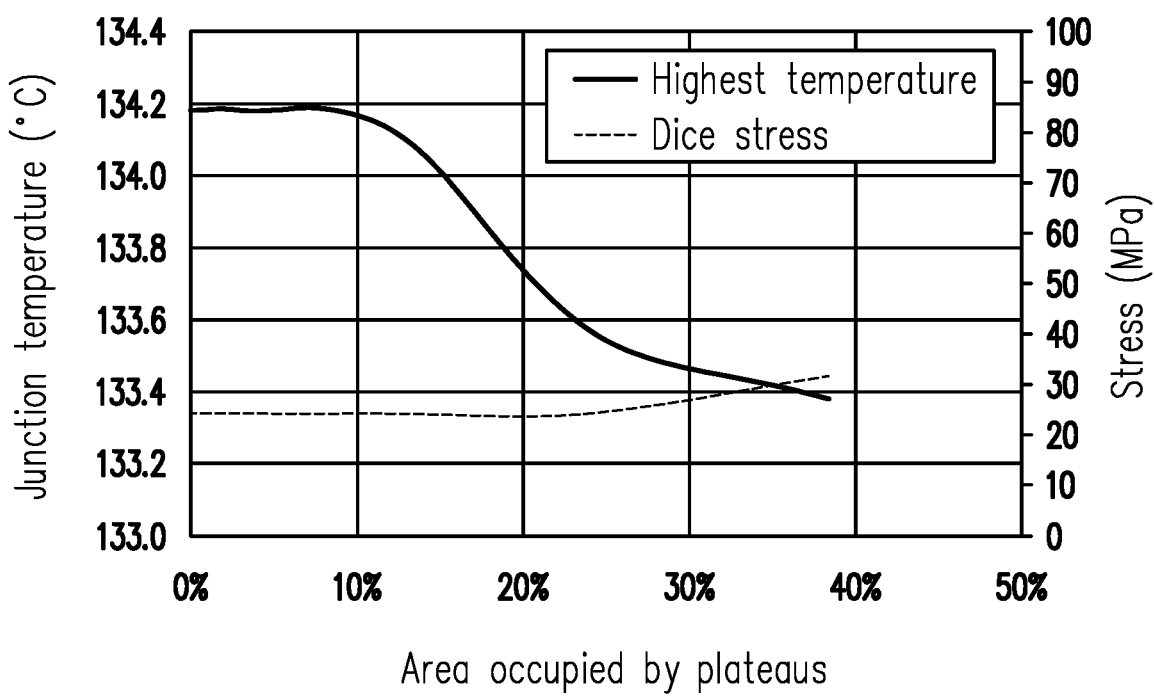
FIG. 5 is a relation diagram of an area occupied by the plateau with respect to the chip temperature and stress for a package structure for power devices of Experimental example 2.

A highest temperature and a dice stress of a junction between the power devices 104 in the condition that the power devices 104 generate the heat was simulated, and a result thereof is as shown in FIG. 5.

According to FIG. 5, the greater the area occupied by the plateaus is, the lower junction temperature the power devices have, wherein it is preferred that the area occupied by the plateaus is between 10% and 35%, and in a specific plateau design, the area occupied by the plateaus is less than 25%, and an effect of reducing the lower junction temperature for the power devices may be achieved in a condition that the dice stress is not increased. Thus, the invention may shorten the heat dissipation path by using the plateaus and ensure that the edge of the heat dissipation insulating substrate still has the thermal interface layer with sufficient thickness while simultaneously reducing the thermal resistance.

Based on the above, in the package structure for power devices provided by the invention, with the plurality of plateaus disposed between the heat dissipation insulating substrate and the heat dissipation plate, the result that the thermal interface layer in different regions has different thicknesses can be achieved. Thereby, while the thermal stress of the heat dissipation insulating substrate is reduced, the thermal resistance of the overall package structure for power devices can also be reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A package structure for power devices, comprising:
a heat dissipation insulating substrate, comprising a first surface and a second surface which are opposite to each other;
a plurality of power devices, coupled to the first surface of the heat dissipation insulating substrate;
a heat dissipation baseplate, disposed at the second surface of the heat dissipation insulating substrate, wherein at least one of a surface of the heat dissipation baseplate and the second surface of the heat dissipation insulating substrate has a plurality of plateaus, the plateaus are disposed within a projected area of all of the power devices, and an area ratio of the plateaus occupying the surface of the heat dissipation baseplate or the second surface of the heat dissipation insulating substrate is between 10% and 35%; and
a thermal interface layer, disposed between the second surface of the heat dissipation insulating substrate and the surface of the heat dissipation baseplate.

2. The package structure for power devices according to claim 1, wherein the plurality of plateaus is monolithically formed or thermally contact with the heat dissipation baseplate or the heat dissipation insulating substrate.

3. The package structure for power devices according to claim 1, wherein a sectional shape of each of the plurality of plateaus is a trapezoidal shape, a triangular shape, a circular shape or a rectangular shape.

4. The package structure for power devices according to claim 1, wherein at least one of the plurality of power devices is coupled to the first surface in a flip-chip bonding manner.

5. The package structure for power devices according to claim 1, further comprising a conductive clip disposed on a side opposite to a side on which the plurality of power devices are bonded to the heat dissipation insulating substrate and electrically connecting the plurality of power devices with the first surface of the heat dissipation insulating substrate.

6. The package structure for power devices according to claim 5, wherein a material of the conductive clip comprises aluminum, copper or a graphite.

7. The package structure for power devices according to claim 1, wherein the heat dissipation insulating substrate comprises a direct bonded copper (DBC) ceramic substrate, a direct plating copper (DPC) ceramic substrate, an insulated metal substrate (IMS) or a printed circuit board (PCB).

8. The package structure for power devices according to claim 1, wherein the thermal interface layer comprises a thermal grease, sintered silver (Ag) or a eutectic solder.

9. A package structure for power devices, comprising:
a heat dissipation insulating substrate, comprising a first surface and a second surface which are opposite to each other,
a plurality of power devices, coupled to the first surface of the heat dissipation insulating substrate;
a heat dissipation baseplate, disposed at the second surface of the heat dissipation insulating substrate, wherein a surface of at least one of the heat dissipation baseplate and the heat dissipation insulating substrate contacting with the thermal interface layer has a plurality of plateaus, the plateaus are disposed within a projected area of all of the power devices, and an area ratio of the plateaus occupying the surface of the heat dissipation baseplate or the second surface of the heat dissipation insulating substrate is between 10% and 35%; and
a thermal interface layer, respectively contacting with and disposed between the second surface of the heat dissipation insulating substrate and the heat dissipation baseplate, wherein a minimum thickness of the thermal interface layer within the projected area of the plurality of power devices is less than a thickness thereof outside the projected area of the plurality of power devices.

10. The package structure for power devices according to claim 9, wherein the plurality of plateaus is monolithically formed or thermally contact with the heat dissipation baseplate or the heat dissipation insulating substrate.

11. The package structure for power devices according to claim 9, wherein the thermal interface layer comprises a thermal grease, sintered Ag or a eutectic solder.

\* \* \* \* \*